(12) United States Patent
Chen et al.

(10) Patent No.: US 9,793,903 B1
(45) Date of Patent: Oct. 17, 2017

(54) DEVICE AND METHOD FOR RECOVERING CLOCK AND DATA

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yen-Chung Chen, Santa Clara, CA (US); Wen-Juh Kang, Tainan (TW); Chen-Yang Pan, Taipei (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/264,574

(22) Filed: Sep. 13, 2016

(30) Foreign Application Priority Data

Apr. 25, 2016 (CN) .......................... 2016 1 0260484

(51) Int. Cl.
*H04L 7/00* (2006.01)
*H03L 7/08* (2006.01)
*H03L 7/091* (2006.01)
*H03K 19/21* (2006.01)
*H04L 7/033* (2006.01)

(52) U.S. Cl.
CPC ........... *H03L 7/0807* (2013.01); *H03K 19/21* (2013.01); *H03L 7/091* (2013.01); *H04L 7/0331* (2013.01)

(58) Field of Classification Search
CPC ....... H03L 7/0807; H03L 7/091; H03K 19/21; H04L 7/0331
See application file for complete search history.

(56) References Cited

U.S. PATENT DOCUMENTS

| 9,148,235 B1* | 9/2015 | Kang | .................... H04B 17/104 |
| 2005/0084048 A1* | 4/2005 | Wu | ........................ H03L 7/0814 375/355 |
| 2007/0085579 A1* | 4/2007 | Wallberg | ................... H03L 7/08 327/156 |

(Continued)

FOREIGN PATENT DOCUMENTS

| TW | 201439714 A | 10/2014 |
| TW | 201614975 A | 4/2016 |

*Primary Examiner* — Dac Ha
(74) *Attorney, Agent, or Firm* — CKC & Partners Co., Ltd.

(57) ABSTRACT

A clock and data recovery device includes a data sampling module, a phase detection circuit, a frequency estimator, a clock generation module, and a data recovery module. The data sampling module samples input data according to first clock signals to generate data values, in which phases of the first clock signals are different from one another. The phase detection circuit detects a phase error of the input data according to at least one second clock signal, to generate an error signal. The frequency estimator generates an adjustment signal according to the error signal, a phase threshold value, and a frequency threshold value. The clock generation module generates the first clock signals and the at least one second clock signal according to the adjustment signal and a reference clock signal. The data recovery module generates recovered data corresponding to the input data according to the data values.

18 Claims, 5 Drawing Sheets

(56) References Cited

U.S. PATENT DOCUMENTS

| | | | |
|---|---|---|---|
| 2009/0086872 A1* | 4/2009 | Liu | H03L 7/0814 |
| | | | 375/371 |
| 2012/0250811 A1* | 10/2012 | Misek | H04L 7/0337 |
| | | | 375/371 |
| 2013/0181754 A1* | 7/2013 | Gupta | H03L 7/0807 |
| | | | 327/150 |
| 2015/0227162 A1* | 8/2015 | Zhu | H03K 5/14 |
| | | | 331/49 |
| 2015/0318978 A1* | 11/2015 | Song | H04L 7/0016 |
| | | | 375/371 |
| 2015/0350191 A1 | 12/2015 | Yang et al. | |

\* cited by examiner

DEVICE AND METHOD FOR RECOVERING CLOCK AND DATA

RELATED APPLICATIONS

This application claims priority to China Application Serial Number 201610260484.2 filed Apr. 25, 2016, which is herein incorporated by reference.

BACKGROUND

Technical Field

The present application relates to an integrated circuit. More particularly, the present application relates to a clock and data recovery device and a method thereof.

Description of Related Art

With the rapid development of process technologies, the operational speed of integrated circuits is significantly improved. In a high-speed communication system, a clock and data recovery (CDR) device is usually utilized to assure that the received input data can be read properly.

In current approaches, the CDR device, which employs a phase-picking circuit architecture, is implemented with feed-forward circuits. When a frequency offset is present between clock signals of the transmitting terminal and clock signals of the receiving terminal, the CDR device, which employs the phase-picking circuit architecture, cannot instantly reduce the frequency offset. As a result, an error occurs in the read data.

SUMMARY

Some aspects of the present disclosure provide a clock and data recovery (CDR) device. The CDR device includes a data sampling module, a phase detection circuit, a frequency estimator, a clock generation module, and a data recovery module. The data sampling module is configured to sample input data according to first clock signals to generate data values, in which phases of the first clock signals are different from one another. The phase detection circuit is configured to detect a phase error of the input data according to at least one second clock signal, to generate an error signal. The frequency estimator is configured to generate an adjustment signal according to the error signal, a phase threshold value, and a frequency threshold value. The clock generation module is configured to generate the first clock signals and the at least one second clock signal according to the adjustment signal and a reference clock signal. The data recovery module is configured to generate recovered data corresponding to the input data according to the data values.

Some aspects of the present disclosure provide a CDR method. The CDR method includes following operations: sampling, according to first clock signals, input data to generate a data values, in which phases of the first clock signals are different from one another; detecting, according to at least one second clock signal, an phase error of the input data, to generate an error signal; generating an adjustment signal according to the error signal, a phase threshold value, and a frequency threshold value; generating the first clock signals and the at least one second clock signal according to the adjustment signal and a reference clock signal; and generating, according to the data values, recovered data corresponding to the input data.

As described above, the CDR device and the CDR method thereof, which are provided in the present disclosure, are able to reduce the frequency offset on the input data, to improve the accuracy of the recovered data.

BRIEF DESCRIPTION OF THE DRAWINGS

This disclosure can be more fully understood by reading the following detailed description of the embodiment, with reference made to the accompanying drawings as follows.

DETAILED DESCRIPTION

Figure 1A:
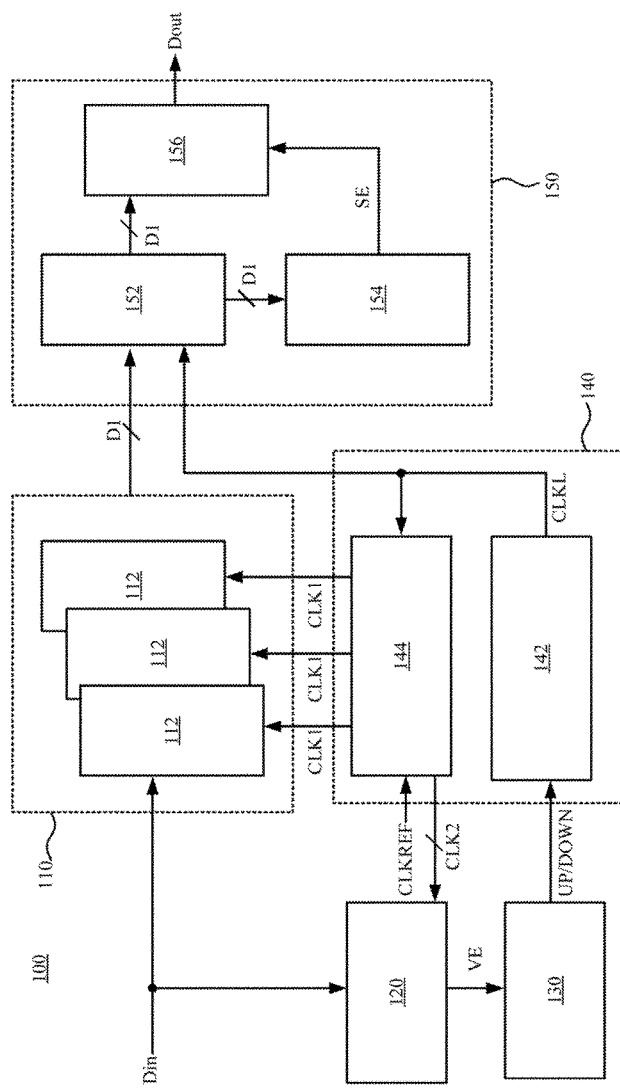
FIG. 1A is a schematic diagram of a clock and data recovery (CDR) device, according to some embodiments of the present disclosure.

Reference will now be made in details to the present embodiments of the disclosure, examples of which are illustrated in the accompanying drawings. Wherever possible, the same reference numbers are used in the drawings and the description to refer to the same or like parts.

Although the terms "first," second, etc., may be used herein to describe various elements, these elements should not be limited by these terms. These terms are used to distinguish one element from another.

In this document, the term "coupled" may also be termed as "electrically coupled," and the term "connected" may be termed as "electrically connected." "Coupled" and "connected" may also be used to indicate that two or more elements cooperate or interact with each other.

Reference is now made to FIG. 1A. FIG. 1A is a schematic diagram of a clock and data recovery (CDR) device 100, according to some embodiments of the present disclosure. For illustration, the CDR device 100 includes a data sampling module 110, a phase detection circuit 120, a frequency estimator 130, a clock generation module 140, and a data recovery module 150.

The data sampling module 110 is configured to receive input data Din, and to sample the input data Din according to clock signals CLK1 to generate data values D1. In some embodiments, the data sampling module 110 includes data samplers 112. The data samplers 122 are configured to receive the input data Din, and are coupled to the clock generation module 140 to receive the clock signals CLK1, in which phases of the clock signals CLK1 are different from one another. With such arrangements, the data samplers 112 are able to sample, according to the different clock signals CLK1, the input data Din at different times, to generate the data values D1. In some embodiments, the data sampler 112 is implemented with an amplifier and a switching capacitor circuit, but the present disclosure is not limited in this regard.

The phase detection circuit 120 is configured to receive the input data Din, and to detect a phase error of the input data Din according to at least one clock signal CLK2, to generate an error signal VE. In some embodiments, the phase detection circuit 120 may include two data samplers (not shown) and a phase detector (not shown). The two data samplers sample the input data Din according to two clock signals CLK2, and output two sampled data values (not shown) to the phase detector. Accordingly, the phase detector is able to compare the two sampled data values to generate the error signal VE. In some embodiments, a phase difference of about 90 degrees is present between the two clock signals CLK2, and the two sampled data values is an in-phase data value and a quadrature value. In some embodiments, the phase detector is a bang-bang phase detector.

The arrangement of the phase detection circuit 120 is given for illustrative purposes only, and the present disclosure is not limited in this regard. Various types of the phase detection circuit 120 are within the contemplated scope of the present disclosure. For example, in some embodiments, the phase detection circuit 120 includes a Hogge phase detector. In some embodiments, the phase detection circuit 120 includes a Muller-Muller phase detector.

The frequency estimator 130 is coupled to the phase detection circuit 120 to receive the error signal VE. The frequency estimator 130 is configured to generate an adjustment signal UP/DOWN to the clock generation module 140, according to the error signal VE, a phase threshold value (e.g., value MP in FIG. 2 below), and a frequency threshold value (e.g., value MF in FIG. 2 below).

The clock generation module 140 is coupled to the frequency estimator 130 to receive the adjustment signal UP/DOWN. The clock generation module 140 is configured to generate the clock signals CLK1 and the at least one clock signal CLK2 according to the adjustment signal UP/DOWN and a reference clock signal CLKREF.

For illustration, in some embodiments, the clock generation module 140 includes a phase interpolator 142 and a multi-phase clock generator 144. The phase interpolator 142 is coupled to the frequency estimator 130 to receive the adjustment signal UP/DOWN, and generates a corresponding local clock signal CLKL according to the adjustment signal UP/DOWN and the reference clock signal CLKREF. For example, assuming that the current local clock signal CLKL has a first phase. When the status of the adjustment signal UP/DOWN is UP, the phase interpolator 142 generates the local clock signal CLKL having a second phase, in which the second phase leads to the first phase. Alternatively, when the status of the adjustment signal UP/DOWN is DOWN, the phase interpolator 142 generates the local clock signal CLKL having a third phase, in which the third phase lags behind the first phase.

The multi-phase clock generator 144 is coupled to the phase interpolator 142 to receive the local clock signal CLKL. The multi-phase clock generator 144 is coupled to the data sampling module 110 to transmit the clock signals CLK1. The multi-phase clock generator 144 is coupled to the phase detection circuit 120 to transmit the at least one clock signal CLK2. The multi-phase clock generator 144 is configured to generate the clock signals CLK1 and the at least one clock signal CLK2 according to the local clock signal CLKL.

The arrangement of the clock generation module 140 is given for illustrative purposes only, and the present disclosure is not limited in this regard. Various types of the clock generation module 140 are within the contemplated scope of the present disclosure.

The data recovery module 150 is coupled to the data sampling module 110, to receive the data values D1. The data recovery module 150 is configured to select corresponding data value according to the data values D1, to generate recovered data Dout corresponding to the input data Din.

For illustration, in some embodiments, the data recovery module 150 includes a data storage circuit 152, an edge detection circuit 154, and a data selection circuit 156. The data storage circuit 152 is coupled to the data samplers 112 to receive and store the data values D1. In some embodiments, the data storage circuit 152 is a shift register. In some other embodiments, as the data values D1 are obtained according to the clock signals CLK1 having different phases, the data storage circuit 152 is able to synchronize, according to the local clock signal CLKL, the data values D1, and to store the synchronized data values D1. The arrangement of the data storage circuit 152 is given for illustrative purposes only, and the present disclosure is not limited in this regard. Various types of the data storage circuit 152 are within the contemplated scope of the present disclosure.

In various embodiments, the edge detection circuit 154 is able to be implemented with a digital circuit, which is able to perform various decision algorithms. The edge detection circuit 154 is coupled to the data storage circuit 152, to read the data values D1 from the data storage circuit 152. The edge detection circuit 154 determines at least one transition point, which includes, for example, a falling edge where a value of logic 1 is switched to a value of logic 0, or a rising edge where the value of logic 0 is switched to the value of logic 1, of the input data Din, to generate a selection signal SE. Accordingly, the data recovery module 150 is able to determine a relation between the data values D1 and boundary data values and a central data value in bit intervals of the input data Din. For ease of understanding, the detail operations are described with FIG. 3.

The data selection circuit 156 is coupled to the edge detection circuit 154 to receive the selection signal SE, and is coupled to the data storage circuit 152 to read the data values D1. The data selection circuit 156 is configured to select, according to the selection signal SE, at least corresponding one data value from the data values D1. For example, the data selection circuit 156 includes a Tally circuit (not shown), an address generation circuit (not shown), and a multiplexer (not shown). In this example, the selection signal SE is multi-bits data that is able to indicate the location of the transition points. The Tally circuit is able to generate a control signal according to the multi-bits data of the selection signal SE, and the address generation circuit then outputs a corresponding address signal according to the control signal. As a result, the multiplexers are able to select a corresponding one from the data values D1 in the data storage circuit 152, and to output the same as the recovered data Dout.

The arrangements of the data selection circuit 156 are given for illustrative purposes only, and the present disclosure is not limited in this regard. Various arrangements of the data selection circuit 156 are within the contemplated scope of the present disclosure.

Figure 1B:
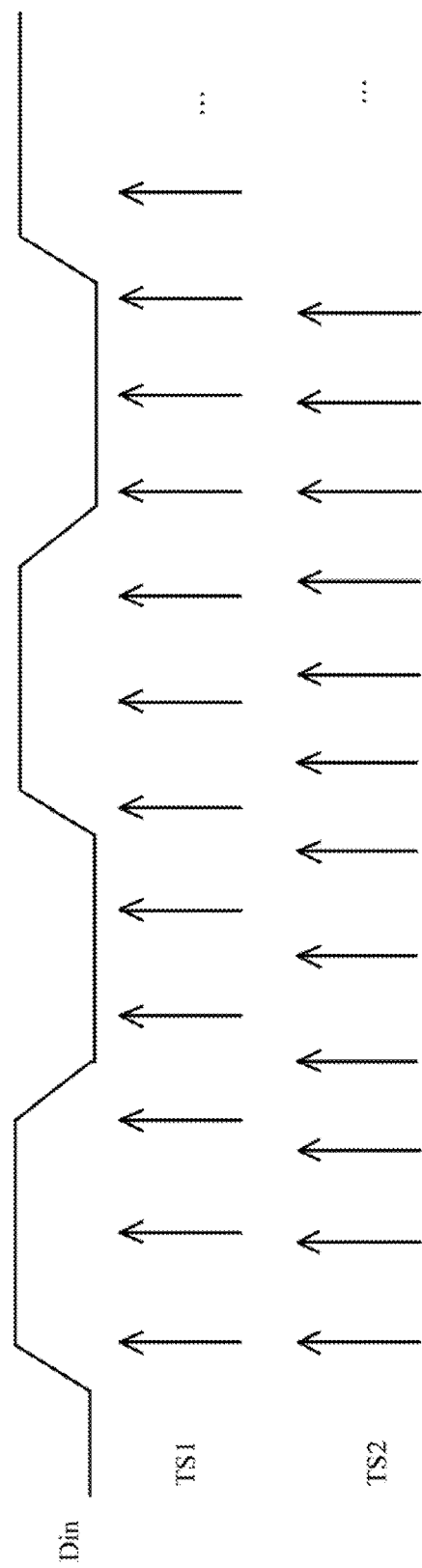
FIG. 1B is a schematic diagram illustrating the sampling operation of the CDR device in FIG. 1A and sampling operation of some approaches, according to some embodiments of the present disclosure.

Reference is now made to FIG. 1B. FIG. 1B is a schematic diagram illustrating the sampling operation of the CDR device 100 in FIG. 1A and sampling operation of some approaches, according to some embodiments of the present disclosure.

In some approaches, a CDR device, which employs a phase-picking architecture, is implemented with a feed forward circuit. If a frequency offset was present in the clock signals between the transmitting, terminal and the receiving terminal, data errors may occur in recovered data generated by the CDR device of such approaches. For illustration, as shown in FIG. 1B, when the frequency offset occurs, as the approaches discussed above only employ the feed forward circuit, the sampling time TS1 would vary gradually, and thus data errors will occur in the sampled data values.

Compared with the approaches above, in the CDR device 100, the phase detection circuit 120, the frequency estimator 130, and the clock generation module 140 are arranged as a feedback control mechanism. With this feedback control mechanism, when a frequency offset is detected to be present in the input data Din, the clock generation module 140 adjusts the local clock signal CLKL correspondingly, to reduce an impact from the frequency offset. As a result, compared with the approaches above, the accuracy of the recovered data Dout is improved. For illustration, as shown in FIG. 1B, when the frequency offset occurs, with the operations of the feedback control mechanism, the sampling time TS2 of the data sampling module 110 can be stabled at a fixed timing, such that the sampled data value is able to be correct.

Several embodiments will be provided in following paragraphs to describe the function and the application of the CDR device 100, but the present disclosure is not limited thereto.

Figure 2:
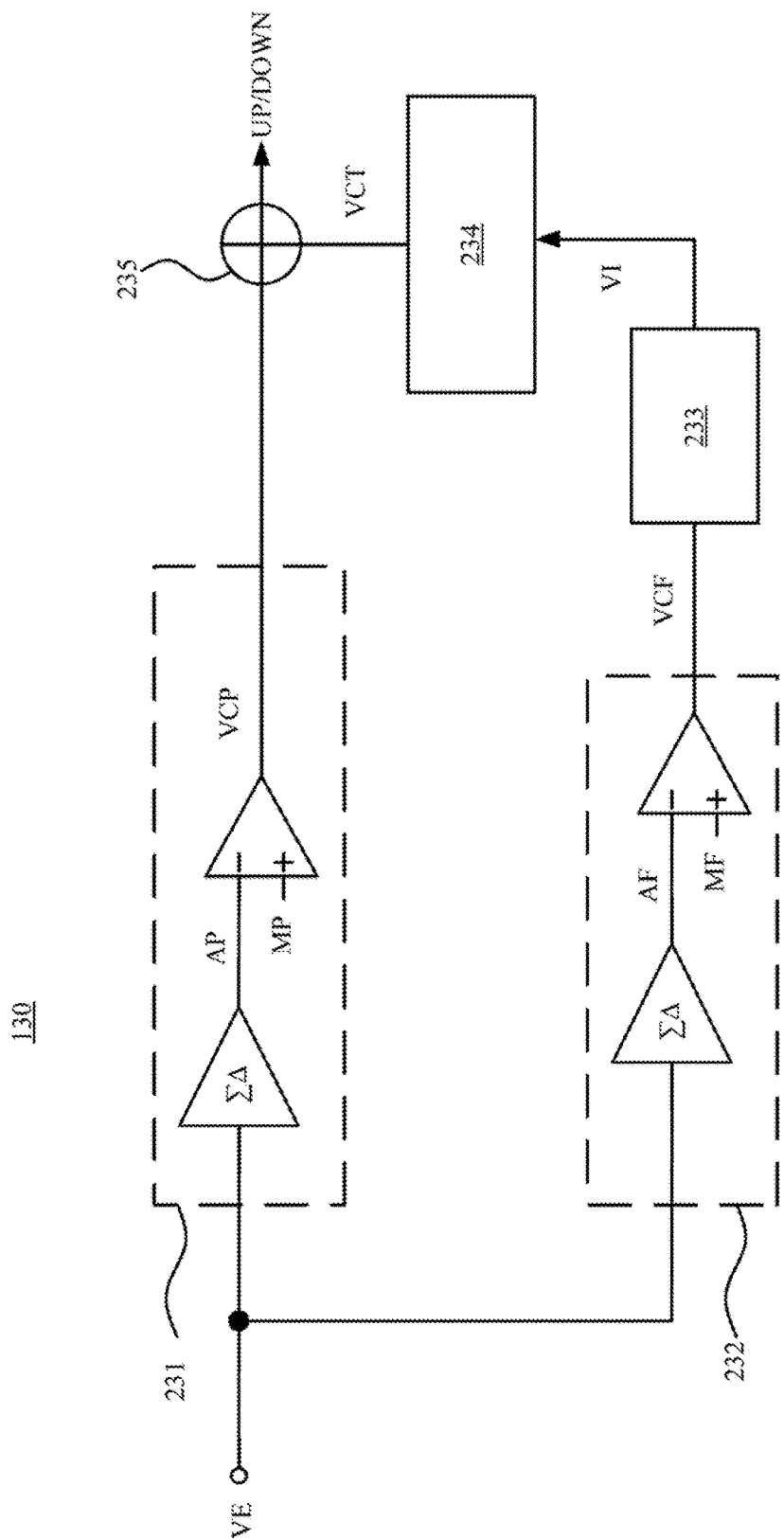
FIG. 2 is a circuit diagram of the frequency estimator in FIG. 1A, according to some embodiments of the present disclosure.

Reference is now made to FIG. 2. FIG. 2 is a circuit diagram of the frequency estimator 130 in FIG. 1A, according to some embodiments of the present disclosure. For ease of understanding, like elements in FIG. 2 are designated with the same reference numbers in FIG. 1A.

In same embodiments, the frequency estimator 130 includes a sigma delta modulator 231, a sigma delta modulator 232, an integrator 233, a counter 234, and an adder 235.

The sigma delta modulator 231 is coupled to the phase detection circuit 120 in FIG. 1A, to receive the error signal VE. The sigma delta modulator 231 is configured to accumulate the error signal VE to generate a phase accumulated value AP, and to compare the phase accumulated value AP with the phase threshold value MP. When the phase accumulated value AP is greater than the phase threshold value MP, the sigma delta modulator 231 outputs a control signal VCP.

The sigma delta modulator 232 is coupled to the phase detection circuit 120 in FIG. 1A, to receive the error signal VE. The sigma delta modulator 232 is configured to accumulate the error signal VE to generate a frequency accumulated value AF, and to compare the frequency accumulated value AF with the frequency threshold value MF. When the frequency accumulated value AF is greater than the frequency threshold value MF, the sigma delta modulator 232 outputs a control signal VCF.

In some embodiments, the phase threshold value MP and the frequency threshold value MF are predetermined values. In some other embodiments, the phase threshold value MP and the frequency threshold value ME are able to be pre-stored in the frequency estimator 130, and to be dynamically adjusted by external programs or circuits.

The integrator 233 is coupled to the sigma delta modulator 232 to receive the control signal VCF. The integrator 233 is configured to accumulate the control signal VCF to generate an integral signal VI. The counter 234 is coupled to the integrator 233 to receive the integral signal VI. The counter 234 is configured to generate a control signal VCT according to the integral signal VI. The adder 235 is coupled to the sigma delta modulator 231 and the counter 234 to receive the control signals VCP and VCT, and sums up the control signal VCP and the control signal VCT to generate the adjustment signal UP/DOWN.

In some embodiments, the control signal VCP, the control signal VCF, the integral signal VI, and the control signal VCT are digital signals having multiple bits. When the frequency accumulated value AF is greater than the frequency threshold value MF, the sigma delta modulator 232 switches the bit values of the control signal VCF, such that the counter 234 starts counting. Accordingly, the counter 234 generates different control signals VCT to the adder 235. Alternatively, when the phase accumulated value AP is greater than the phase threshold value MP, the sigma delta modulator 231 switches the bit values of the control signal VCP, such that the adder 235 generates different adjustment signals UP/DOWN. With such arrangement, when a frequency offset occurs in the input data Din, the clock generation module 140 is able to adjust the local clock signal CLKL according to the adjustment signal UP/DOWN, to improve the accuracy of the recovered data Dout.

The arrangement of the frequency estimator 130 is given for illustrative purposes only, and the present disclosure is not limited in this regard. Various types of the frequency estimator 130 are also within the contemplated scope of the present disclosure.

Figure 3:
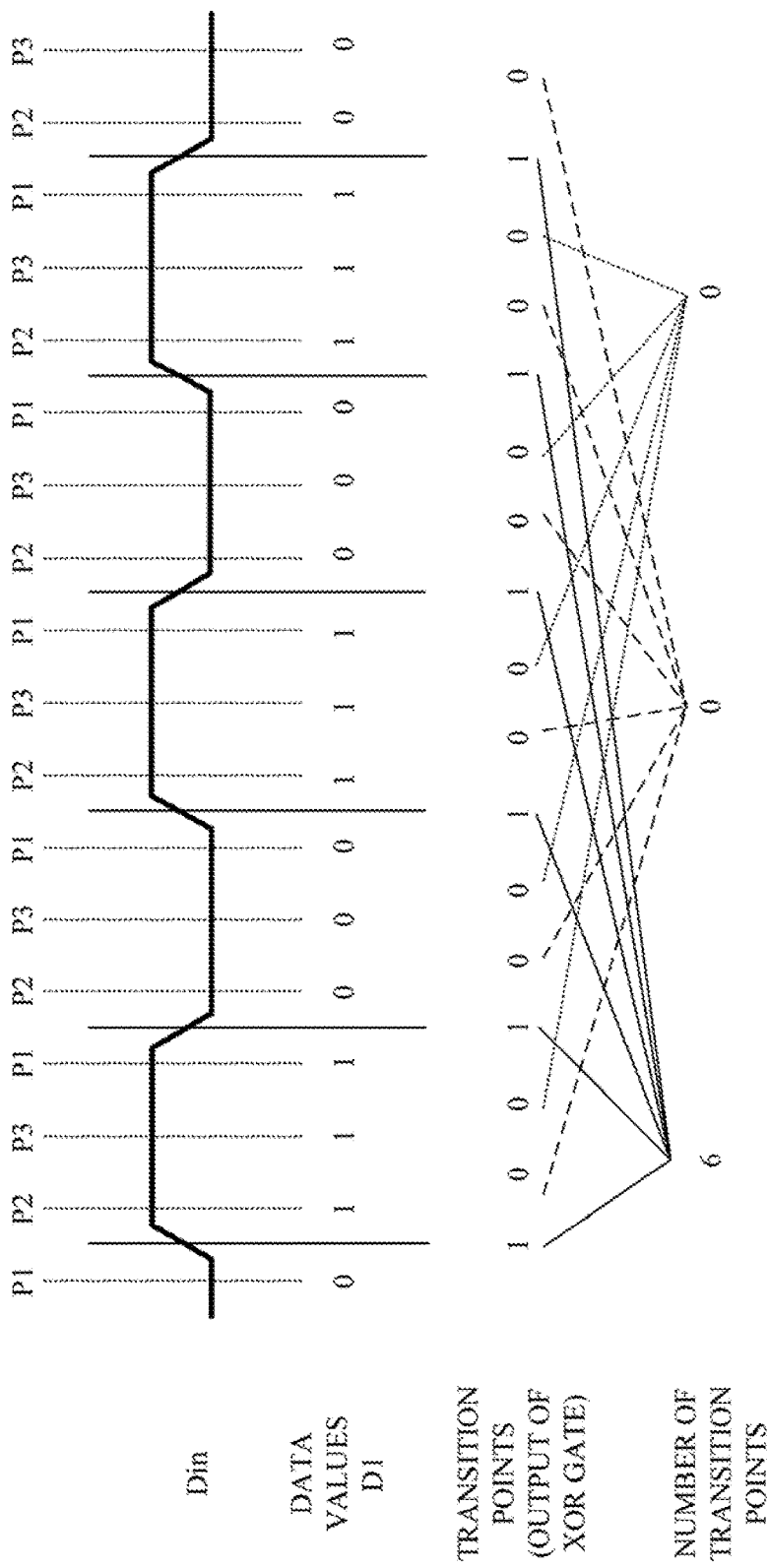
FIG. 3 is a schematic diagram illustrating operations of the edge detection circuit in FIG. 1A according to some embodiments of the present disclosure.

Reference is now made to FIG. 3. FIG. 3 is a schematic diagram illustrating operations of the edge detection circuit 154 in FIG. 1A according to some embodiments of the present disclosure. For ease of understanding, like elements of FIG. 3 are designated with the same reference numbers in FIG. 1A. For illustration, in this example, the data sampling module 110 utilizes three clock signals CLK1 to sample the bit intervals of the input data Din, in which the phases of the three clock signals CLK1 are P1, P2, and P3, respectively.

For illustration, as shown in FIG. 3, the six sampled data values D1, which are sequentially sampled by the data samplers 112 according to the three clock signals CLK1, are "0", "1", "1", "1", "0", and "0." In this example, the edge detection circuit 154 can perform an exclusive OR (XOR) operation according to two adjacent data values D1, to detect at least one transition point of the input data Din. For example, the edge detection circuit 154 includes XOR gates. A first XOR gate outputs a signal having a value of logic 1 according to a first data value D1 ("0") and a second data value D1 ("1"). A second XOR gate outputs a signal having a value of logic 0 according to the second data value D1 ("1") and a third data value D1 ("1"). Based on the signal, which is outputted from the first XOR gate, having the value of logic 1, it is able to determine that a transition point of the input data Din is present between the two corresponding sampling times (i.e., the clock signal CLK1 having the phase P1 and the clock signal CLK1 having the phase P2). Based on the signal, which is outputted from the second XOR gate, having the value of logic 0, it is able to determine that no transition point of the input data Din is present between the two corresponding sampling times (i.e., the clock signal CLK1 having the phase P2 and the clock signal CLK1 having the phase P3). With this analogy, it is able to analyze the transition points of the input data Din according to the signals outputted from the XOR gates.

For example, as shown in FIG. 3, a number of the transition points occurring at the corresponding sampling times (i.e. between the phases P1 and P2) is six, and the number of the transition points occurring, at other sampling times (i.e. between the phases P2 and P3) is 0. Accordingly, the edge detection circuit 154 thus determines that the data values D1, which are sampled according the clock signal CLK1 having the phase P1 or P2, is a rising edge or a falling edge of the input data Din, and that the data values D1, which are sampled according the clock signal CLK1 having the phase P3, is a central data value of the input data Din. As a result, the edge detection circuit 154 outputs a corresponding selection signal SE, to make the data selection circuit 156 select at least one, which corresponds to the central data values of the input data Din, of the data values D1. In some embodiments, the aforementioned operations of determining the transition points of the input data Din according to the number of the transition points are referred to as a center-picking algorithm. In some embodiments, the aforementioned operations of determining the number of the transition points of the input data Din are performed by the Tally circuit.

In some other embodiments, the edge detection circuit 154 is also able to be implemented with digital circuits that perform a majority-voting algorithm. For illustration, as shown in FIG. 3, the first three data values, which are sequentially sampled by the data sampler 112 according to the three clock signals CLK1, are "0", "1," and "1." As the number of the data values D1 having the value of logic 1 is greater, the edge detection circuit 154 determines that the value of logic 1 is the central data value of the input data Din, and then determines that the data values D1, which are sampled according to the clock signal CLK1 having the phase P1, are rising or falling edges of the input data Din.

The arrangements of the edge detection circuit 154 are given for illustrative purposes only, and the present disclosure is not limited in this regard. Various decision algorithms, which are able to be employed by the edge detection circuit 154, are also within the contemplated scope of the present disclosure.

Figure 4:
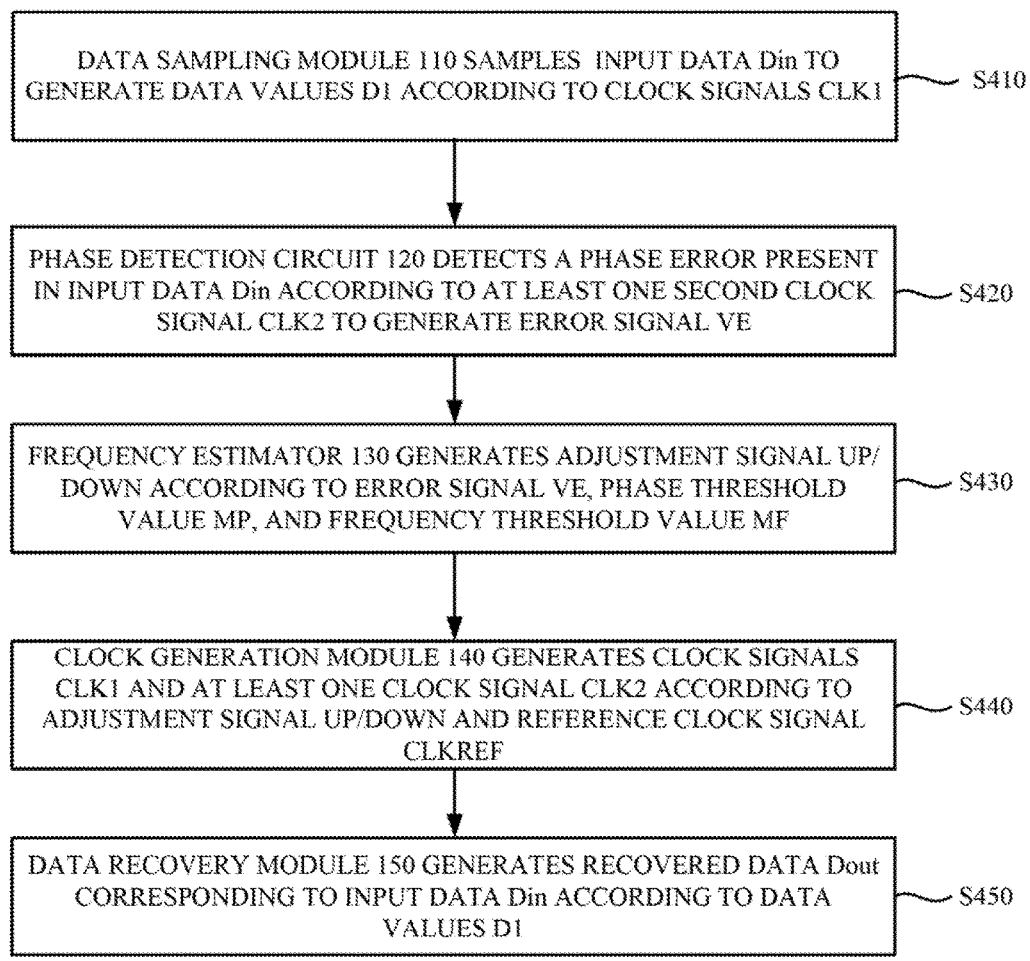
FIG. 4 is a flow hart of a CDR method according to some embodiments of the present disclosure.

FIG. 4 is a flow chart of a CDR method 400 according to some embodiments of the present disclosure. For ease of understanding, reference is now made to both of FIG. 1A and FIG. 4, and operations of the CDR device 100 are described with the CDR method 400.

In operation S410, the data sampling module 110 samples the input data Din to generate data values D1 according to the clock signals CLK1. For illustration, as shown in FIG. 1A, the data samplers 112 sample the input data Din according to the clock signals CLK1 having different phases, to continuously generate the data values D1.

In operation S420, the phase detection circuit 120 detects a phase error present in the input data Din according to at least one second clock signal CLK2 to generate the error signal VE. As described above, the phase detection circuit 120 can employ various types of the phase detectors to analyze the input data Din, to generate the error signal VE according to the phase error of the input data Din.

In operation S430, the frequency estimator 130 generates the adjustment signal UP/DOWN according to the error signal VE, the phase threshold value MP, and the frequency threshold value MF. For illustration, as shown in FIG. 2, the frequency estimator 130 can compare the error signal VE with the phase threshold value MP, and compare the error signal VE with the frequency threshold value MF, so as to generate the corresponding adjustment signal UP/DOWN.

In operation S440, the clock generation module 140 generates the dock signals CLK1 and the at least one clock signal CLK2 according to the adjustment signal UP/DOWN and the reference clock signal CLKREF. As described above, the phase detection circuit 120, the frequency estimator 130, and the clock generation module 140 are arranged as a feedback control mechanism. Effectively, with such feedback control mechanism, the clock generation module 140 is able to dynamically adjust the clock signals CLK1 and the at least one clock signal CLK2 according to the adjustment signal UP/DOWN In operation S450, the data recovery module 150 generates the recovered data Dout corresponding to the input data Din according to the data values D1. For illustration, as described above, the edge detection circuit 154 is able to analyze the transition points of the input data Din by performing various decision algorithms, to determine which one of the data values is the central data value of the input data Din. Accordingly, the data selection circuit 156 can select at least one data value, which corresponds to the central data value of the input data Din, from the data values D1, to generate the recovered data Dout.

The above illustrations of the CDR method 400 include exemplary operations, but the operations are not necessarily performed in the order shown. Operations may be added, replaced, changed order, and/or eliminated as appropriate, in accordance with the spirit and scope of various embodiments of the present disclosure.

As described above, the CDR device 100 and the CDR method 400 thereof, which are provided in the present disclosure, are able to reduce the frequency offset on the input data, to improve the accuracy of the recovered data.

Although the present disclosure has been described in considerable details with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A clock and data recovery device, comprising:
a data sampling circuitry configured to sample input data according to a plurality of first clock signals to generate a plurality of data values, wherein phases of the first clock signals are different from one another;
a phase detection circuit configured to detect a phase error of the input data according to at least one second clock signal, to generate an error signal;
a frequency estimator configured to generate an adjustment signal according to the error signal, a phase threshold value, and a frequency threshold value;
a clock generation circuitry configured to generate the first clock signals and the at least one second clock signal according to the adjustment signal and a reference clock signal;
a data recovery circuitry configured to generate recovered data corresponding to the input data according to the data values; and
wherein the frequency estimator comprises:
a first sigma delta modulator configured to accumulate the error signal to generate a phase accumulated value, and to output a first control signal when the phase accumulated value is greater than the phase threshold value;
a second sigma delta modulator configured to accumulate the error signal to generate a frequency accumulated value, and to output a second control signal when the frequency accumulated value is greater than the frequency threshold value;
an integrator configured to accumulate the second control signal to generate an integral signal;
a counter configured to generate a third control signal according to the integral signal; and an adder configured to sum up the first control signal and the third control signal to generate the adjustment signal.

2. The clock and data recovery device of claim 1, wherein the phase threshold value and the frequency threshold value are predetermined values.

3. The clock and data recovery device of claim 1, wherein the phase threshold value and the frequency threshold value are configured to be stored in the frequency estimator.

4. The clock and data recovery device of claim 1, wherein the data recovery circuitry comprises:
   a data storage circuit configured to store the data values;
   an edge detection circuit configured to determine at least one transition point of the input data according to the data values, to generate a selection signal; and
   a data selection circuit configured to select at least corresponding one of the data values from the data storage circuit according to the selection signal, to generate the recovered data.

5. The clock and data recovery device of claim 4, wherein the data storage circuit is further configured to synchronize the data values according to a local clock signal.

6. The clock and data recovery device of claim 4, wherein the edge detection circuit is configured to perform an exclusive OR operation according two adjacent of the data values to determine the at least one transition point.

7. The clock and data recovery device of claim 4, wherein the edge detection circuit is configured to perform a majority-voting algorithm according to the data values to determine the at least one transition point.

8. The clock and data recovery device of claim 1, wherein the clock generation circuitry comprises:
   a multi-phase clock generator configured to generate the first clock signals and the at least one second clock signal according to a local clock signal; and
   a phase interpolator configured to generate the local clock signal according to the adjustment signal and the reference clock signal.

9. The clock and data recovery device of claim 1, wherein the phase detection circuit, the frequency estimator, and the clock generation circuitry are arranged as a feedback control mechanism.

10. A clock and data recovery method, comprising:
    sampling, according to a plurality of first clock signals, input data to generate a plurality of data values, wherein phases of the first clock signals are different from one another;
    detecting, according to at least one second clock signal, an phase error of the input data, to generate an error signal;
    generating an adjustment signal according to the error signal, a phase threshold value, and a frequency threshold value;
    generating the first clock signals and the at least one second clock signal according to the adjustment signal and a reference clock signal;
    generating, according to the data values, recovered data corresponding to the input data; and
    wherein the operation of generating the adjustment signal comprises:
    accumulating, by a first sigma delta modulator, the error signal to generate a phase accumulated value, and outputting a first control signal when the phase accumulated value is greater than the phase threshold value;
    accumulating, by a second sigma delta modulator, the error signal to generate a frequency accumulated value, and outputting a second control signal when the frequency accumulated value is greater than the frequency threshold value;
    accumulating, by an integrator, the second control signal to generate an integral signal;
    counting up, by a counter, according to the integral signal to generate a third control signal; and
    summing up, by an adder, the first control signal and the third control signal to generate the adjustment signal.

11. The clock and data recovery method of claim 10, wherein the phase threshold value and the frequency threshold value are predetermined values.

12. The clock and data recovery method of claim 10, wherein the operation of generating the recovered data comprises:
    storing the data values;
    determining, according to the data values, at least one transition point of the input data to generate a selection signal; and
    selecting, according to the selection signal, at least corresponding one of the data values to generate the recovered data.

13. The clock and data recovery method of claim 12, further comprising:
    synchronizing the data values according to a local clock signal.

14. The clock and data recovery method of claim 13, wherein the operation of determining the at least one transition point comprises:
    performing an exclusive OR operation according two adjacent of the data values to determine the at least one transition point.

15. The clock and data recovery method of claim 13, wherein the operation of determining the at least one transition point comprises:
    performing a center-picking algorithm according to the data values to determine the at least one transition point.

16. The clock and data recovery method of claim 13, wherein the operation of determining the at least one transition point comprises:
    performing a majority-voting algorithm according to the data values to determine the at least one transition point.

17. The clock and data recovery method of claim 10, wherein the operations of generating the error signal, generating the adjustment signal, and the operation of the first clock signals and the at least one second clock signal are configured to as feedback control operations.

18. The clock and data recovery method of claim 10, wherein the operation of generating the first clock signals and the at least one second clock signal comprises:
    generating, according to a local clock signal, the first clock signals and the at least one second clock signal; and
    generating, by a phase interpolator, the local clock signal according to the adjustment signal and the reference clock signal.

* * * * *